United States Patent
Tamaki

(10) Patent No.: US 6,977,523 B2
(45) Date of Patent: Dec. 20, 2005

(54) VOLTAGE LEVEL SHIFTING CIRCUIT

(75) Inventor: Takashi Tamaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/621,368

(22) Filed: Jul. 18, 2003

(65) Prior Publication Data

US 2004/0061525 A1    Apr. 1, 2004

Related U.S. Application Data

(60) Provisional application No. 60/413,753, filed on Sep. 27, 2002.

(51) Int. Cl.[7] .................. H03K 19/0175; H03K 19/094
(52) U.S. Cl. ........................................ 326/68; 327/333
(58) Field of Search ............................ 326/63, 68, 80, 326/81; 327/333

(56) References Cited

U.S. PATENT DOCUMENTS

| 5,113,097 A | 5/1992 | Lee |
| 5,559,464 A * | 9/1996 | Orii et al. .................. 327/333 |
| 5,736,869 A * | 4/1998 | Wei .............................. 326/81 |
| 6,064,229 A * | 5/2000 | Morris ........................ 326/81 |

* cited by examiner

Primary Examiner—Daniel Chang
(74) Attorney, Agent, or Firm—Volentine Francos & Whitt, PLLC

(57) ABSTRACT

The voltage level shifting circuit includes a complimentary signal input circuit having a pair of MOSs of a first withstand voltage and a load circuit having a pair of MOSs of a second withstand voltage, a first voltage down-converting element which prevents a potential level exceeding the first withstand voltage from being supplied to a complementary signal input circuit, and a third MOS of the second withstand voltage electrically connecting a third power supply node to an output node responsive to a voltage potential from the load circuit. The voltage level shifting circuit also includes a fourth MOS of the first withstand voltage electrically connecting a first power supply node to the output node responsive to one of the voltage potentials of the complimentary signal, and a second voltage down-converting element which prevents a potential level exceeding the first withstand voltage from being supplied to the fourth MOS.

16 Claims, 3 Drawing Sheets

VOLTAGE LEVEL SHIFTING CIRCUIT

This application claims priority under 35 USC § 119 (e) (1) of provisional application No. 60/413,753 filed Sep. 27, 2002.

BACKGROUND OF THE INVENTION

1. Field of the Invention

The present invention relates to a voltage level shifting circuit which outputs a signal outputted from a circuit which operates on low power supply voltage to a circuit which operates on high power supply voltage. Especially, the present invention relates to a voltage level shifting circuit which is suitable for a drive circuit for driving a LCD panel and a drive circuit for driving a fluorescence display tube.

2. Description of the Related Art

For example, the U.S. Pat. No. 5,113,097 (Lee) exists as technology relevant to the present invention. In FIG. 4 of Lee, a level shifting circuit which changes an incoming signal Vin having logic levels of 0v (Vss1) and 15v (+VDD) into an output signal Vout having logic levels of −5 v (−Vss2) and 15v (+VDD) is described. That is, changing the signal which has relatively small logic amplitude into the signal which has relatively large logic amplitude is described in Lee.

Referring to FIG. 4 of Lee, the PMOS transistor 206 and the PMOS transistor 208, which have gate electrode receiving the incoming signal Vin which has small logic amplitude, are connected between the power supply +VDD and the power supply −Vss2. The difference between the potential level of the power supply +VDD and the potential level of the power supply Vss1 is 15v. On the other hand, the difference between the potential level of the power supply +VDD and the potential level of the power supply −Vss2 is 20v, and this value is larger than the difference between the potential level of the power supply +VDD and the potential level of the power supply Vss1. Therefore, it is required that withstand voltages of the PMOS transistor 206 and the PMOS transistor 208 are higher than those of MOS transistors which constitute the inverter 404 and the inverter 202. (In order to simplify an explanation, in subsequent explanation, a transistor having lower withstand voltage is referred to as a low withstand voltage transistor, and a transistor having higher withstand voltage is referred to as a high withstand voltage transistor.) By the same reason, the PMOS transistor 408, the NMOS transistor 210, the NMOS transistor 212, and the NMOS transistor 410 comprise the high withstand voltage transistor, and each transistor which constitutes the inverter 404 and the inverter 202 comprise the low withstand voltage transistor.

When gate to source voltages are set into the same value, generally it is known that the current supply capability of the high withstand voltage transistor is low as compared with the current supply capability of the low withstand voltage transistor. FIG. 1 is a figure showing the difference of the current supply capability of the high withstand voltage transistor and the current supply capability of the low withstand voltage transistor. In FIG. 1, an NMOS transistor whose gate to source voltage Vgs is set at 5v is explained as an example. L indicates the gate length of the transistor and W indicates the gate width of the transistor. IDS indicates drain to source current and VDS indicates drain to source voltage. In FIG. 1, when drain to source voltage is set at 1.0v, the low withstand voltage transistor can flow 3.0 mA current and the high withstand voltage transistor can flow only 500 µA current are shown as an example. This means that the size (dimension of a transistor) of the high withstand voltage transistor needs to be set up by about 6 times the size of the low withstand voltage transistor in order to obtain the current supply capability equivalent to the low withstand voltage transistor. The current supply capability relates also to an operation speed of a transistor. This means also that the size (dimension of a transistor) of the high withstand voltage transistor needs to be set up by about 6 times the size of the low withstand voltage transistor in order to obtain the operation speed equivalent to the low withstand voltage transistor.

In the drive circuit for driving the fluorescence display tube and the drive circuit for driving the LCD panel, level shifting circuits corresponding to a number of the display element are required. The number is several 100 circuits from some dozens of circuits. Therefore, when the voltage level shifting circuit having above described structure is simply applied to the above mentioned drive circuit, there is a possibility that an area on a chip for forming the drive circuit may increase in order to increase the operation speed of the drive circuit more. Or in order to reduce the size of the area on the chip for forming the drive circuit more, or in order to maintain the area on the chip, there is a possibility that it may be difficult to make the operation speed of the drive circuit increase. Therefore, there has been a demand for a voltage level shifting circuit which has an improved operation speed and an improved circuit area for forming a circuit.

SUMMARY OF THE INVENTION

According to one aspect of the present invention, for satisfying one or more of the above demands, there is provided a voltage level shifting circuit that includes a first power supply node supplied with a first power supply potential level; a second power supply node supplied with a second power supply potential level higher than the first power supply potential level; and a third power supply node supplied with a third power supply potential level higher than the second power supply potential level.

The voltage level shifting circuit further includes a signal input circuit which is coupled between the first power supply node and the second power supply node, which receives a signal having the first and second power supply potential levels, and which outputs a complementary signal having the first and second power supply potential levels; a complimentary signal input circuit which is coupled to the first power supply node and which includes a first pair of MOS transistors, each of the first MOS transistors has a first withstand voltage and has a first electrode coupled to the first power supply node, a second electrode, and a gate electrode receiving the complementary signal and a load circuit which is coupled to the third power supply node and which includes a second pair of MOS transistors, each of the second MOS transistors has a second withstand voltage higher than the first withstand voltage and has a first electrode coupled to the third power supply node, a second electrode, and a gate electrode.

The voltage level shifting circuit also includes a first voltage down-converting element which is coupled between the load circuit and the complimentary signal input circuit and which prevents a potential level exceeding the first withstand voltage from supplying to the complimentary signal input circuit; a third MOS transistor which is coupled between the third power supply node and an output node, which has the second withstand voltage, and which electrically connects the third power supply node to the output node in response to a voltage potential outputted from the load circuit and a fourth MOS transistor which is coupled between the first power supply node and the output node, which has the first withstand voltage, and which electrically connects the first power supply node to the output node in response to one of the voltage potentials of the complimentary signal.

The voltage level shifting circuit also includes a second voltage down-converting element which is coupled between the third MOS transistor and the fourth MOS transistor and which prevents a potential level exceeding the first withstand voltage from supplying to the fourth MOS transistor.

The above novel features of the invention will more fully appear from the following detailed description, appended claims and the accompanying drawings.

DETAILED DESCRIPTION OF THE PREFERRED EMBODIMENTS

Figure 1:
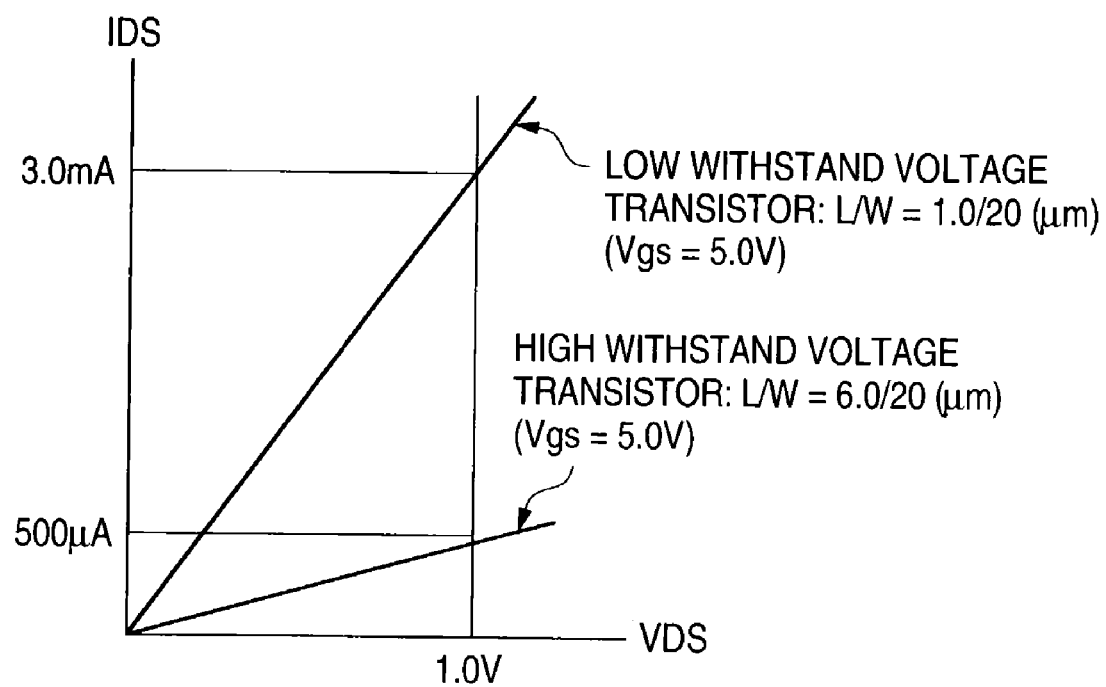
FIG. 1 is a figure showing the difference between the current supply capability of the high withstand voltage transistor and the current supply capability of the low withstand voltage transistor.

A voltage level shifting circuit according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

Figure 2:
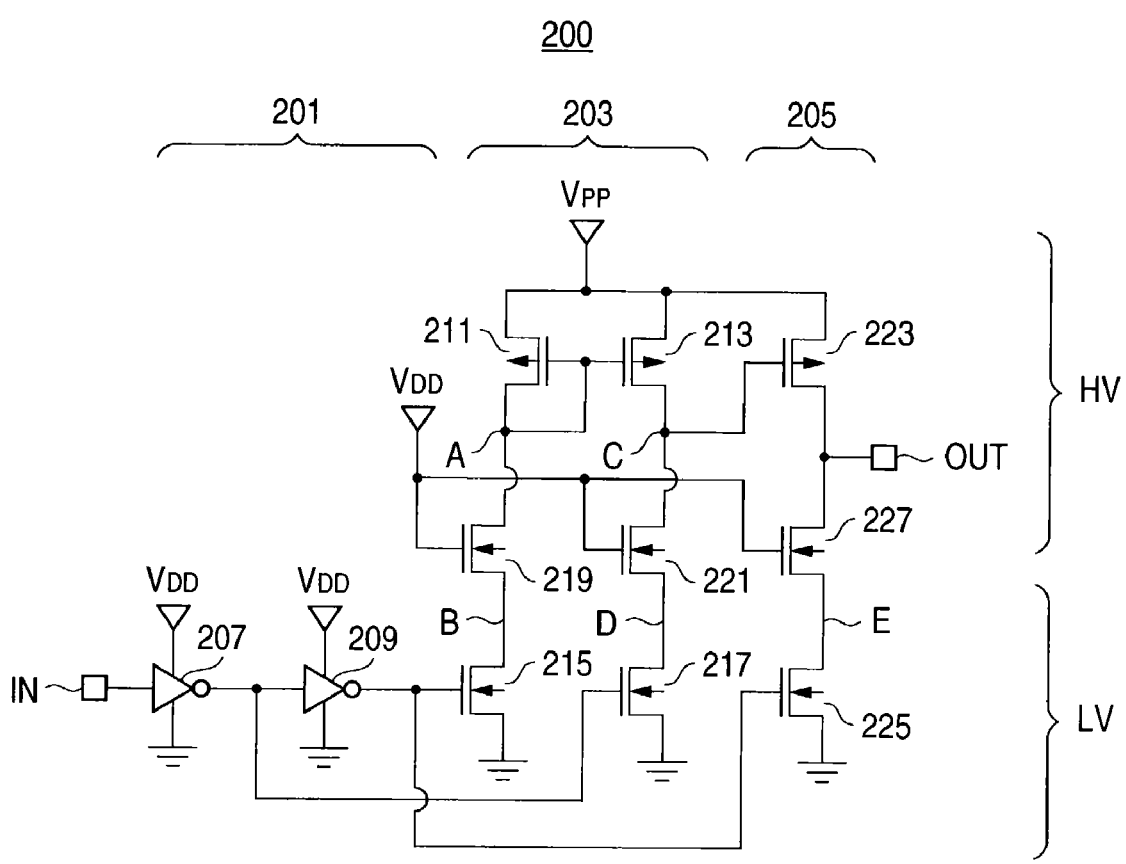
FIG. 2 is a circuit diagram showing a voltage level shift circuit 200 according to a first preferred embodiment of the present invention.

FIG. 2 is a circuit diagram showing a voltage level shift circuit 200 according to a first preferred embodiment of the present invention.

The voltage level shift circuit 200 is formed on a semiconductor substrate, and mainly composed of a signal input part 201, a level shift part 203, and a signal output part 205.

The signal input part 201 has an inverter 207 and an inverter 209 to which a power supply potential VDD and a ground potential VSS are supplied. The level of the power supply potential VDD is 5v and is set as the level lower than the level of the power supply potential VPP mentioned later. The level of the ground potential VSS is 0v. The inverter 207 and the inverter 209 comprise a well-known CMOS inverter. The signal which is outputted from an internal circuit not illustrated and is applied to an input terminal IN has an amplitude between the power supply potential VDD and the ground potential VSS. (This amplitude is called a first amplitude in order to simplify an explanation.) In other words, a high level of the signal applied to the input terminal IN is about 5v, and a low level is about 0v. The inverter 207 and the inverter 209 receive the signal having the first amplitude, and output the signal having the first amplitude. Since only relatively low voltage (it is about 5v at the maximum) is applied to drain electrodes of MOS transistors which constitutes the inverter 207 and the inverter 209, the high withstand voltage characteristic is not required to these transistors. Therefore, these transistors are formed in a low withstand voltage transistor forming area LV as a low withstand voltage transistor. Since an operation speed of the low withstand voltage transistor is faster than an operation speed of the high withstand voltage transistor, the signal having the first amplitude applied to the input terminal IN is transferred to the latter level shift part 203 at high speed. Since the low withstand voltage transistor can be formed with the transistor which has relatively short gate length and narrow gate width, the area which the signal input part 201 occupies on a semiconductor substrate is relatively small.

The level shift part 203 has a PMOS transistor 211, a PMOS transistor 213, an NMOS transistor 215, an NMOS transistor 217, an NMOS transistor 219, and an NMOS transistor 221, which are provided between a power supply potential VPP and the ground potential VSS. The level of the power supply potential VPP is 20v, and is set as the level higher than the level of the power supply potential VDD. The level of the ground potential VSS is 0v.

A current mirror type differential amplification circuit comprises a PMOS transistor 211, a PMOS transistor 213, an NMOS transistor 215, and an NMOS transistor 217.

The PMOS transistor 211 has a source electrode connected to the power supply potential VPP, and drain and gate electrodes connected to a drain electrode of the NMOS transistor 219. The PMOS transistor 213 has a source electrode connected to the power supply potential VPP, a drain electrode connected to a drain electrode of the NMOS transistor 221, and a gate electrode connected to the gate electrode of the PMOS transistor 211. Current mirror type load consists of the PMOS transistor 211 and the PMOS transistor 213.

The NMOS transistor 215 has a source electrode connected to the ground potential VSS, a drain electrode connected to a source electrode of the NMOS transistor 219, and a gate electrode connected to the output terminal of the inverter 209. The NMOS transistor 217 has a source electrode connected to the ground potential VSS, a drain electrode connected to a source electrode of the NMOS transistor 221, and a gate electrode connected to the output terminal of the inverter 207. A pair of signal input transistors of the differential amplification circuit consist of the NMOS transistor 215 and the NMOS transistor 217.

The NMOS transistor 219 has the drain electrode connected to the drain electrode of the PMOS transistor 211, the source electrode connected to the drain electrode of the NMOS transistor 215, and a gate electrode connected to the power supply potential VDD. The NMOS transistor 221 has the drain electrode connected to the drain electrode of the PMOS transistor 213, the source electrode connected to the drain electrode of the NMOS transistor 217, and a gate electrode connected to the power supply potential VDD. The NMOS transistor 219 and the NMOS transistor 221 connected between the current mirror type load circuit and a pair of signal input transistors. These NMOS transistors 219 and 221 constitute a voltage relief element (a voltage down-converting element) which makes the voltage applied to the drain electrodes of the pair of signal input transistors ease or descent.

Since relatively high voltage (it is about 20v at the maximum) is applied to the drain electrodes of the NMOS transistor 211, the NMOS transistor 213, the NMOS transistor 219, and the NMOS transistor 221, the high withstand voltage characteristics is required to these transistors. Therefore, these transistors are formed in a high withstand voltage transistor forming area HV as the high withstand voltage transistor.

The power supply potential VDD (5v) lower than the power supply potential VPP (20v) is applied to the gate electrode of the NMOS transistor 219. Therefore, although relatively high voltage (about 20v) is applied to the drain electrode of the NMOS transistor 219, the voltage applied to the drain electrode itself does not appear in the source electrode. In detail, (VDD-Vtn) is applied to the source electrode of the NMOS transistor 219. The Vtn indicates a threshold voltage of the NMOS transistor 219, and the value is about 1v. Consequently, only relatively low voltage, about 4v at the maximum, is applied to the drain electrode of the NMOS transistor 215. Similarly, the power supply potential VDD (5v) lower than the power supply potential VPP (20v) is applied to the gate electrode of the NMOS transistor 221. Therefore, although relatively high voltage (about 20v) is applied to the drain electrode of the NMOS transistor 221, the voltage applied to the drain electrode itself does not appear in the source electrode. In detail, (VDD-Vtn) is applied to the source electrode of the NMOS transistor 217. The Vtn indicates the threshold voltage of the NMOS transistor 221 here, and the value is about 1v. Consequently, only relatively low voltage, about 4v at the maximum, is applied to the drain electrode of the NMOS transistor 217.

Since only relatively low voltage (it is about 4v at the maximum) is applied to the drain electrodes of the NMOS transistor 215 and the NMOS transistor 217, the high withstand voltage characteristics is not required to these transistors. Therefore, these transistors are formed in the low withstand voltage transistor forming area LV as the low withstand voltage transistor. Since the operation speed of the low withstand voltage transistor is quicker than the operation speed of the high withstand voltage transistor, the signal having the first amplitude outputted from the signal input part 201 can operate the differential amplification circuit at high speed. That is, the level of the drain electrode of the PMOS transistor 213 which is the output of the level shift part 203 is decided at high speed.

When the high withstand voltage transistors are used for the NMOS transistor 215 and the NMOS transistor 217 in order to obtain current supply capability equivalent to the case where the low withstand voltage transistors are used for the NMOS transistor 215 and the NMOS transistor 217, about 6 times area is needed on the semiconductor substrate as compared with the case where the low withstand voltage transistors are used for the NMOS transistor 215 and the NMOS transistor 217. Therefore, area which the level shift part 203 occupies on the semiconductor substrate can be made small, without decreasing a speed of operation, though two high withstand voltage transistors are added as the voltage relief element (voltage descent element).

The signal output part 205 has a PMOS transistor 223, a NMOS transistor 225, and a NMOS transistor 227, provided between the power supply potential VPP and the ground potential VSS. The signal output part 205 outputs a signal having a second amplitude. The second amplitude is made up of the power supply potential VPP as a logic high level and the ground potential VSS as a logic low level.

The PMOS transistor 223 has a source electrode connected to the power supply potential VPP, a drain electrode connected to an output terminal OUT, and a gate electrode connected to the drain electrode of the PMOS transistor 213. The NMOS transistor 225 has a source electrode connected to the ground potential VSS, and a drain electrode connected to the a source electrode of the NMOS transistor 227, and a gate electrode connected to the output terminal of the inverter 209. The PMOS transistor 223 is a transistor for charge and which supplies the power supply potential VPP to an unillustrated load connected to the output terminal OUT. The NMOS transistor 225 is a transistor for discharge and which supplies the power supply potential VSS to the unillustrated load connected to the output terminal OUT.

The NMOS transistor 227 has the drain electrode connected to the output terminal OUT, the source electrode connected to the drain electrode of the NMOS transistor 225, and a gate electrode connected to the power supply potential VDD. This NMOS transistor 227 constitutes the voltage relief element (voltage descent element) which makes the voltage applied to the drain electrode of the NMOS transistor 225 ease (descent).

Since relatively high voltage (it is about 20v at the maximum) is applied to the drain electrode of the NMOS transistor 223, the high withstand voltage characteristics is required to the NMOS transistor 223. Therefore, this transistor is formed in the high withstand voltage transistor forming area HV as the high withstand voltage transistor.

The power supply potential VDD (5v) lower than the power supply potential VPP (20v) is applied to the gate electrode of the NMOS transistor 227. Therefore, although relatively high voltage (about 20v) is applied to the drain electrode of the NMOS transistor 227, the voltage applied to the drain electrode itself does not appear in the source electrode. In detail, (VDD-Vtn) is applied to the source electrode of the NMOS transistor 227. The Vtn indicates the threshold voltage of the NMOS transistor 227 here, and the value is about 1v. Consequently, only relatively low voltage, about 4v at the maximum, is applied to the drain electrode of the NMOS transistor 225.

Since only relatively low voltage (it is about 4v at the maximum) is applied to the drain electrode of the NMOS transistor 225, the high withstand voltage is not required to this transistor. Therefore, the transistor is formed in the low withstand voltage transistor forming area LV as the low withstand voltage transistor. Since the operation speed of the low withstand voltage transistor is quicker than the operation speed of the high withstand voltage transistor, the signal having the first amplitude outputted from the inverter 209 can make the NMOS transistor 225 a conductive state at high speed. That is, the low level output of the signal output part 205 is decided at high speed.

Next, operation of the voltage level shift circuit as shown in FIG. 2 is explained.

The incoming signal having the logic amplitude of 0v (ground potential VSS) and 5v (power supply potential VDD) is applied to the input terminal IN from the internal circuit not illustrated The 0v incoming signal shows the logic the low level, and the 5v incoming signal shows the logic high level.

When the incoming signal of high level (5v) is applied to the input terminal IN, the inverter 207 outputs the low level (0v). The inverter 209 receives the signal of the low level and outputs the high level (5v).

The NMOS transistor 215 enters into an ON state, when the NMOS transistor 215 receives the high level signal. When the NMOS transistor 215 enters into the ON state, a first current path between the power supply potential VPP and the ground potential VSS which consisted of the PMOS transistor 211, the NMOS transistor 219, and the NMOS transistor 215 is in the conductive state.

In detail, when the NMOS transistor 215 is in the ON state, the potential of node A and node B descends in the direction of 0v. The drain to source voltage of the NMOS transistor 219 is set so that the NMOS transistor 219 operates in a saturation region. Therefore, the potential of node A is set to a level which applied drain to source voltage Vds of the NMOS transistor 219 to the potential of node B.

When the potential of node A changes in the direction of 0v, the PMOS transistor 211 enters into the ON state, and then the current is flowed through the first current path between the power supply potential VPP and the ground potential VSS by the ON state PMOS transistor 211.

However, restriction is added to the current flowing through the first current path between the power supply potential VPP and the ground potential VSS by the NMOS transistor 219 which operates in the saturation region.

That is, although current of the predetermined quantity determined with the NMOS transistor 219 flows through the first current path while the level of the signal applied to the input terminal IN is in the high level current more than drain to source current determined by the NMOS transistor 219 does not flow through the first current path. Therefore, current consumption does not increase sharply.

Since the PMOS transistor 211 and the PMOS transistor 213 constitute the current mirror circuit, the PMOS transistor 213 enters into the ON state by the PMOS transistor 211 enters into the ON state. Current tends to be passed through the second current path between the power supply potential VPP and the ground potential VSS by the ON state PMOS transistor 213.

On the other hand, since the NMOS transistor 217 receives the signal of the low level, the NMOS transistor 217 is in an OFF state.

When the NMOS transistor 217 is in the OFF state, the second current path, which is consisted of the PMOS transistor 213, the NMOS transistor 221, and the NMOS transistor 217 and which is provided between the power supply potential VPP and the ground potential VSS, is in a cut off state.

In detail, when the NMOS transistor 217 enters into the OFF state, the potential of node C and node D tends to rise in the direction of 20v. Since only 5v is applied to the gate electrode of the NMOS transistor 221, the potential of node D descends to about 4v (5v minus 1v), without reaching 20v. The potential of node C changes to about 20v by the ON state PMOS transistors 213.

When the potential of node C changes to 20v, the PMOS transistor 223 enters into the OFF state, and then the PMOS transistor 223 of the signal output part 205 changes into the OFF state by the OFF state PMOS transistor 223.

Since the NMOS transistor 225 of the signal output part 205 has received the high level signal, the NMOS transistor 225 changes into the ON state. When the NMOS transistor 225 enters into the ON state, the potential of node E descends in the direction of 0v Thereby, the electric charge of the load connected to the output terminal OUT is discharged by the NMOS transistor 225.

Next, when the incoming signal of the low level (0v) is applied to the input terminal IN, the inverter 207 outputs high level (5v). The inverter, 209 receives the high level signal and outputs the low level (0v).

Since the NMOS transistor 215 receives the signal of the low level, the NMOS transistor 215 changes into the OFF state. When the NMOS transistor 215 changes into the OFF state, the first current path enters into the cut off state.

In detail, when the NMOS transistor 215 is in the OFF state, the potential of node A and node B tends to rise in the direction of 20v. Since only 5v is applied to the gate electrode of the NMOS transistor 219, the potential of node B descends to about 4v (5v minus 1v), without reaching 20v.

Since the potential of node A rises to about 20v, the PMOS transistor 211 changes into the OFF state. Since the PMOS transistor 213 and the PMOS transistor 211 constitute the current mirror circuit, when the PMOS transistor 211 is in the OFF state, the PMOS transistor 213 changes into the OFF state.

On the other hand, since the NMOS transistor 217 receives the high level signal, the NMOS transistor 217 changes to the ON state. When the NMOS transistor 217 changes into the ON state, the potential of node D descends in the direction of 0v. Thereby, the potential of node C descends to 0v.

When the potential of node C changes to 0v, the PMOS transistor 223 of the signal output part 205 changes into the ON state. On the other hand, since the NMOS transistor 225 receives the signal of the low level, the NMOS transistor 225 changes into the OFF state. Therefore, the PMOS transistor 223 outputs the power supply potential VPP to the output terminal OUT. Thereby, the load connected to the output terminal OUT is charged by the PMOS transistor 223.

At this time, the potential of node E tends to rise in the direction of 20v. However, since only 5v is applied to the gate electrode of the NMOS transistor 227, the potential of node E rises to only about 4v (5v minus 1v), without the potential of node E becoming 20v.

As it can be understood from the above operation, the voltage level shift circuit 200 has the function which changes and outputs the signal having the first amplitude to the signal having the second amplitude larger than the first amplitude.

In the first preferred embodiment of the present invention, since a pair of signal input transistors (for example, the NMOS transistor 215, the NMOS transistor 217) and the electric discharge transistor (for example, NMOS transistor 225) of the output circuit part each of which receives the signal having the first amplitude of relatively small amplitude consist of the low withstand voltage transistor, the voltage level shift circuit having an improved operation speed can be provided. Furthermore, the voltage level shift circuit which can reduce the area for forming a circuit can be provided, maintaining an operation speed.

In addition, in the voltage level shift circuit of the first preferred embodiment, the example whose level of the ground potential VSS is 0v is explained as an example. However, as long as the potential (potential applied to the sources of the NMOS transistor 215, the NMOS transistor 217, and the NMOS transistor 225) applied to the ground potential VSS is the potential which can make these MOS transistors an OFF state, it may be negative potential.

In the voltage level shift circuit of the first preferred enforcement, potential levels applied to the gate electrodes of the NMOS transistor 219, the NMOS transistor 221, and the NMOS transistor 227 which function as the voltage relieve element (the voltage down element or the voltage descent element) are 5v is explained as an example. However, this potential level may be set at a potential level so that the potential level applied to the drain electrodes of the NMOS transistor 215, the NMOS transistor 217, and the NMOS transistor 225 does not destroy these transistors. For example, this potential may be 6v or 7v. However, since an additional circuit for generating the 6v is needed, it is preferable that it is the same 5v as power supply potential.

Second Preferred Embodiment

Figure 3:
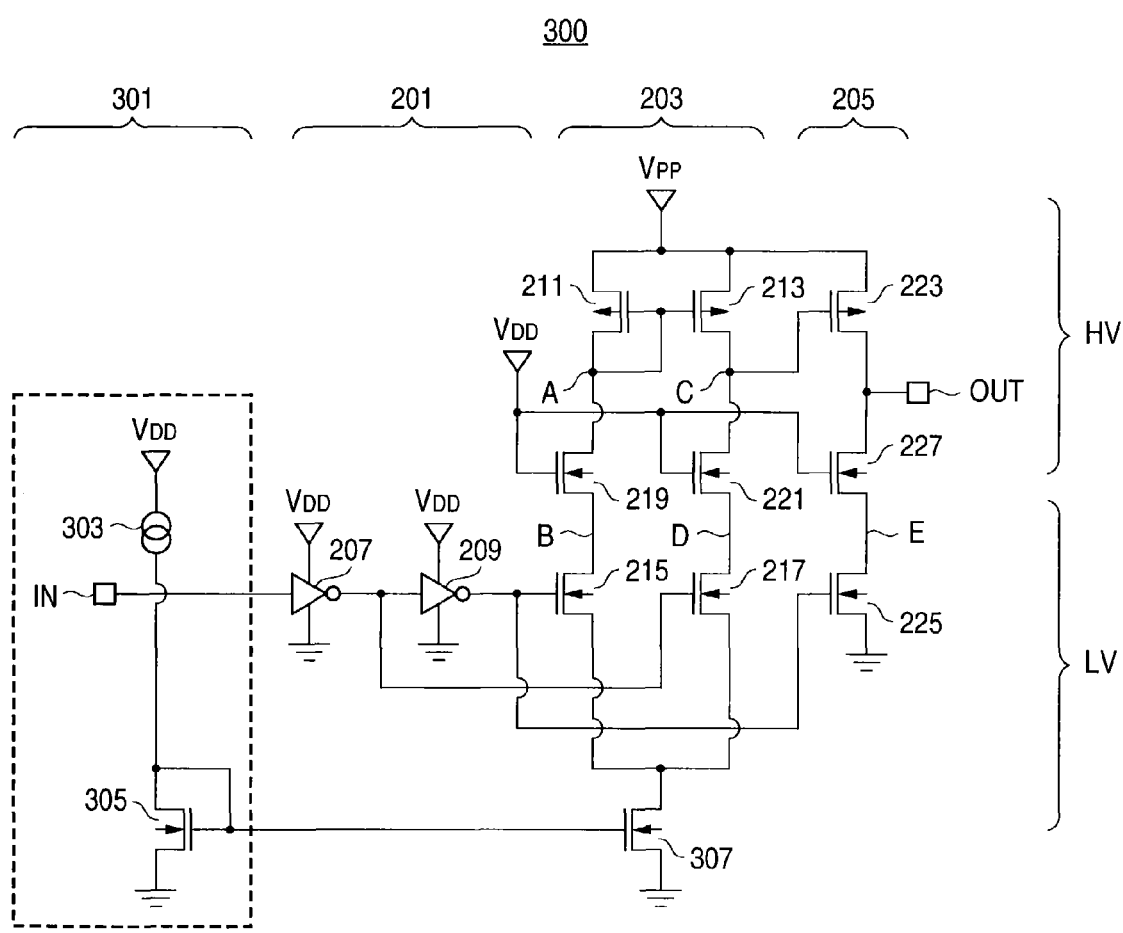
FIG. 3 is a circuit diagram showing a voltage level shift circuit 300 according to a second preferred embodiment of the present invention.

FIG. 3 is a circuit diagram showing a voltage level shift circuit 300 according to the second preferred embodiment of the present invention.

The difference between the second preferred embodiment and the first preferred embodiment resides in that a reference current source 301 and an NMOS transistor 307 are added to a voltage level shift circuit 300.

The reference current source 301 and the NMOS transistor 307 are also formed on the semiconductor substrate.

The structure of the level shift part 203 differs from the structure of the voltage level shift circuit of the first preferred embodiment. That is, a source electrode of the NMOS transistor 215 and a source electrode of the NMOS transistor 217 are commonly connected to a drain electrode of the NMOS transistor 307. The NMOS transistor 307 is connected between the ground potential VSS and the source electrodes of the NMOS transistor 215 and the NMOS transistor 217. The NMOS transistor 307 and an NMOS transistor 305 constitute the current mirror circuit. Therefore, the NMOS transistor 307 functions as a constant current element.

In the second preferred embodiment, the PMOS transistor 211, the PMOS transistor 213, the NMOS transistor 215, the NMOS transistor 217, and the NMOS transistor 307 constitute the current mirror type differential amplification circuit. The NMOS transistor 307 constitutes the constant current transistor of this differential amplification circuit.

Since only relatively low voltage (it is about 4v at the maximum) is applied to the drain electrode of this NMOS transistor 307, the high withstand voltage characteristics is not required to these transistors. Therefore, these transistors are formed in the low withstand voltage transistor forming area LV as the low withstand voltage transistor.

The reference current source 301 includes a constant current source 303 and the NMOS transistor 305. The constant current source 303 is connected between the power supply potential VDD and a drain electrode of the NMOS transistor 305.

The NMOS transistor 305 has a source electrode connected to the ground potential VSS, the drain electrode connected to the constant current source 303, and a gate electrode connected to the drain electrode thereof and the gate electrode of the NMOS transistor 307.

Since only relatively low voltage (it is about 4v at the maximum) is applied to the drain electrode of the NMOS transistor 305, the high withstand voltage characteristics is not required to the transistor. Therefore, this transistor is also formed in the low withstand voltage transistor forming area LV as the low withstand voltage transistor. The constant current source 303 is formed in the low withstand voltage transistor forming area LV as the low withstand voltage transistor as well.

Next, an operation of the voltage level shift circuit 300 of the second preferred embodiment is explained hereinafter. Basically, operation of the voltage level shift circuit 300 shown in FIG. 3 is the same as the operation of the voltage level shift circuit 200 shown in FIG. 2. Therefore, in subsequent explanation, only a different point is explained and dual explanation is omitted.

The reference current source 301 generates a predetermined current between the power supply potential VDD and the ground potential VSS. Since the NMOS transistor 305 and the NMOS transistor 307 constitute the current mirror circuit, the NMOS transistor 307 functions as the constant current source of the differential amplification circuit. That is, current which flows through the level shift part 203 can be set up by setting the characteristic of the constant current source 303, which comprises the reference current source 301 and the NMOS transistor 305, as suitable value. For example, current which flows through the level shift circuit part 203 can be more decreased by decreasing current which flows from the constant current source 303. As a result, it is enabled to control easily current which the voltage level shift circuit consumes.

As explained above, in the voltage level shift circuit of the second preferred embodiment, the effect that current which the voltage level shift circuit consumes is easily controllable can be obtained.

While the preferred form of the present invention has been described, it is to be understood that modifications will be apparent to those skilled in the art without departing from the spirit of the invention. The scope of the invention is to be determined solely by the following claims.

What is claimed is:

1. A voltage level shifting circuit comprising:
a first power supply node supplied with a first power supply potential level;
a second power supply node supplied with a second power supply potential level higher than the first power supply potential level;
a third power supply node supplied with a third power supply potential level higher than the second power supply potential level;
a signal input circuit which is coupled between the first power supply node and the second power supply node, which receives a signal having the first and second power supply potential levels, and which outputs complementary signals having the first and second power supply potential levels;
a complimentary signal input circuit which is coupled to the first power supply node and which includes a pair of first MOS transistors, each of the first MOS transistors has a first withstand voltage and has a first electrode coupled to the first power supply node, a second electrode, and a gate electrode receiving one of the complementary signals;
a load circuit which is coupled to the third power supply node and which includes a pair of second MOS transistors, each of the second MOS transistors has a second withstand voltage higher than the first withstand voltage and has a first electrode coupled to the third power supply node, a second electrode, and a gate electrode;
a first voltage down-converting circuit which is coupled between the load circuit and the complimentary signal input circuit, and which prevents a potential level exceeding the first withstand voltage from being supplied to the complimentary signal input circuit;
a third MOS transistor which is coupled between the third power supply node and an output node, which has the second withstand voltage, and which electrically connects the third power supply node to the output node in response to a voltage potential output from the load circuit;
a fourth MOS transistor which is coupled between the first power supply node and the output node, which has the first withstand voltage, which has a gate directly coupled to one of the complimentary signals, and which electrically connects the first power supply node to the output node in response to a voltage potential of the one of the complimentary signals; and
a second voltage down-converting circuit which is coupled between the third MOS transistor and the fourth MOS transistor and which prevents a potential level exceeding the first withstand voltage from being supplied to the fourth MOS transistor.

2. The voltage level shifting circuit according to claim 1, wherein the first voltage down-converting circuit comprises a pair of fifth MOS transistors, each of which has a first electrode coupled to the load circuit, a second electrode coupled to the corresponding second electrodes of the first MOS transistors, and a gate electrode supplied with a fixed voltage potential level.

3. The voltage level shifting circuit according to claim 2, wherein the fixed voltage potential level is the second power supply potential level.

4. The voltage level shifting circuit according to claim 1, wherein the second voltage down-converting circuit comprises a sixth MOS transistor which has a first electrode coupled to the third MOS transistor, a second electrode coupled to the fourth MOS transistor, and a gate electrode supplied with a fixed voltage potential level.

5. The voltage level shifting circuit according to claim 4, wherein the fixed voltage potential level is the second power supply potential level.

6. A voltage level shifting circuit comprising:
 a first power supply node supplied with a first power supply potential level;
 a second power supply node supplied with a second power supply potential level higher than the first power supply potential level;
 a third power supply node supplied with a third power supply potential level higher than the second power supply potential level;
 a signal input circuit which is coupled between the first power supply node and the second power supply node, which receives a signal having the first and second power supply potential levels, and which outputs complementary signals having the first and second power supply potential levels;
 a complimentary signal input circuit which is coupled to the first power supply node and which includes a pair of first MOS transistors, each of the first MOS transistors has a first withstand voltage and has a first electrode coupled to the first power supply node, a second electrode, and a gate electrode receiving one of the complementary signals;
 a load circuit which is coupled to the third power supply node and which includes a pair of second MOS transistors, each of the second MOS transistors has a second withstand voltage higher than the first withstand voltage and has a first electrode coupled to the third power supply node, a second electrode, and a gate electrode;
 a first voltage down-converting circuit which is coupled between the load circuit and the complimentary signal input circuit, and which prevents a potential level exceeding the first withstand voltage from being supplied to the complimentary signal input circuit;
 a third MOS transistor which is coupled between the third power supply node and an output node, which has the second withstand voltage, and which electrically connects the third power supply node to the output node in response to a voltage potential output from the load circuit;
 a fourth MOS transistor which is coupled between the first power supply node and the output node, which has the first withstand voltage, and which electrically connects the first power supply node to the output node in response to one of voltage potentials of the complimentary signals; and
 a second voltage down-converting circuit which is coupled between the third MOS transistor and the fourth MOS transistor and which prevents a potential level exceeding the first withstand voltage from being supplied to the fourth MOS transistor,
 wherein the pair of second MOS transistors constitute a current mirror load.

7. A voltage level shifting circuit comprising:
 a first power supply node supplied with a first power supply potential level;
 a second power supply node supplied with a second power supply potential level higher than the first power supply potential level;
 a third power supply node supplied with a third power supply potential level higher than the second power supply potential level;
 a signal input circuit which is coupled between the first power supply node and the second power supply node, which receives a signal having the first and second power supply potential levels, and which outputs complementary signals having the first and second power supply potential levels;
 a complimentary signal input circuit which is coupled to the first power supply node and which includes a pair of first MOS transistors, each of the first MOS transistors has a first withstand voltage and has a first electrode coupled to the first power supply node, a second electrode, and a gate electrode receiving one of the complementary signals;
 a load circuit which is coupled to the third power supply node and which includes a pair of second MOS transistors, each of the second MOS transistors has a second withstand voltage higher than the first withstand voltage and has a first electrode coupled to the third power supply node, a second electrode, and a gate electrode;
 a first voltage down-converting circuit which is coupled between the load circuit and the complimentary signal input circuit, and which prevents a potential level exceeding the first withstand voltage from being supplied to the complimentary signal input circuit;
 a third MOS transistor which is coupled between the third power supply node and an output node, which has the second withstand voltage, and which electrically connects the third power supply node to the output node in response to a voltage potential output from the load circuit;
 a fourth MOS transistor which is coupled between the first power supply node and the output node, which has the first withstand voltage, and which electrically connects the first power supply node to the output node in response to one of voltage potentials of the complimentary signals;
 a second voltage down-converting circuit which is coupled between the third MOS transistor and the fourth MOS transistor and which prevents a potential level exceeding the first withstand voltage from being supplied to the fourth MOS transistor; and
 a constant current element which is coupled between the first electrodes of the first MOS transistors and the first power supply node.

8. The voltage level shifting circuit according to claim 7, wherein the constant current element comprises a MOS transistor.

9. A voltage level shift circuit comprising:
 a first power supply node supplied with a first power supply potential level;

a second power supply node supplied with a second power supply potential level higher than the first power supply potential level;

a third power supply node supplied with a third power supply potential level higher than the second power supply potential level;

a signal input circuit which is coupled between the first power supply node and the second power supply node, which receives a signal having the first and second power supply potential levels, and which outputs complementary signals having the first and second power supply potential levels;

a complimentary signal input circuit which is coupled to the first power supply node and which includes a pair of first MOS transistors, each of the first MOS transistors has a first withstand voltage and has a first electrode coupled to the first power supply node, a second electrode, and a gate electrode receiving one of the complementary signals;

a load circuit which is coupled to the third power supply node and which includes a pair of second MOS transistors, each of the second MOS transistors has a second withstand voltage higher than the first withstand voltage and has a first electrode coupled to the third power supply node, a second electrode, and a gate electrode;

a first voltage descending circuit which is coupled between the load circuit and the complimentary signal input circuit, and which prevents a potential level exceeding the first withstand voltage from being supplied to the complimentary signal input circuit;

a third MOS transistor which is coupled between the third power supply node and an output node, which has the second withstand voltage, and which electrically connects the third power supply node to the output node in response to a voltage potential output from the load circuit;

a fourth MOS transistor which is coupled between the first power supply node and the output node, which has the first withstand voltage, which has a gate directly coupled ot one of the complimentary signals, and which electrically connects the first power supply node to the output node in response to the voltage potential of the one of the complimentary signals; and a second voltage descending circuit which is coupled between the third MOS transistor and the fourth MOS transistor and which prevents a potential level exceeding the first withstand voltage from being supplied to the fourth MOS transistor.

10. The voltage level shifting circuit according to claim 9, wherein the first voltage descending circuit comprises a pair of fifth MOS transistors, each of which has a first electrode coupled to the load circuit, a second electrode coupled to the corresponding second electrodes of the first MOS transistors, and a gate electrode supplied with a fixed voltage potential level.

11. The voltage level shift circuit according to claim 10, wherein the fixed voltage potential level is the second power supply potential level.

12. The voltage level shift circuit according to claim 9, wherein the second voltage descending circuit comprises a sixth MOS transistor which has a first electrode coupled to the third MOS transistor, a second electrode coupled to the fourth MOS transistor, and a gate electrode supplied with a fixed voltage potential level.

13. The voltage level shift circuit according to claim 12, wherein the fixed voltage potential level is the second power supply potential level.

14. A voltage level shift circuit comprising:
a first power supply node supplied with a first power supply potential level;
a second power supply node supplied with a second power supply potential level higher than the first power supply potential level;
a third power supply node supplied with a third power supply potential level higher than the second power supply potential level;
a signal input circuit which is coupled between the first power supply node and the second power supply node, which receives a signal having the first and second power supply potential levels, and which outputs complementary signals having the first and second power supply potential levels;
a complimentary signal input circuit which is coupled to the first power supply node and which includes a pair of first MOS transistors, each of the first MOS transistors has a first withstand voltage and has a first electrode coupled to the first power supply node, a second electrode, and a gate electrode receiving one of the complementary signals;
a load circuit which is coupled to the third power supply node and which includes a pair of second MOS transistors, each of the second MOS transistors has a second withstand voltage higher than the first withstand voltage and has a first electrode coupled to the third power supply node, a second electrode, and a gate electrode;
a first voltage descending circuit which is coupled between the load circuit and the complimentary signal input circuit, and which prevents a potential level exceeding the first withstand voltage from being supplied to the complimentary signal input circuit;
a third MOS transistor which is coupled between the third power supply node and an output node, which has the second withstand voltage, and which electrically connects the third power supply node to the output node in response to a voltage potential output from the load circuit;
a fourth MOS transistor which is coupled between the first power supply node and the output node, which has the first withstand voltage, and which electrically connects the first power supply node to the output node in response to one of voltage potentials of the complimentary signals; and
a second voltage descending circuit which is coupled between the third MOS transistor and the fourth MOS transistor and which prevents a potential level exceeding the first withstand voltage from being supplied to the fourth MOS transistor,
wherein the pair of second MOS transistors constitute a current mirror load.

15. A voltage level shift circuit comprising:
a first power supply node supplied with a first power supply potential level;
a second power supply node supplied with a second power supply potential level higher than the first power supply potential level;
a third cower supply node supplied with a third power supply potential level higher than the second power supply potential level;
a signal input circuit which is coupled between the first power supply node and the second power supply node, which receives a signal having the first and second power supply potential levels, and which outputs complementary signals having the first and second power supply potential levels;

a complimentary signal input circuit which is coupled to the first power supply node and which includes a pair of first MOS transistors, each of the first MOS transistors has a first withstand voltage and has a first electrode coupled to the first power supply node, a second electrode, and a gate electrode receiving one of the complementary signals;

a load circuit which is coupled to the third power supply node and which includes a pair of second MOS transistors, each of the second MOS transistors has a second withstand voltage higher than the first withstand voltage and has a first electrode coupled to the third power supply node, a second electrode, and a gate electrode;

a first voltage descending circuit which is coupled between the load circuit and the complimentary signal input circuit, and which prevents a potential level exceeding the first withstand voltage from being supplied to the complimentary signal input circuit;

a third MOS transistor which is coupled between the third power supply node and an output node, which has the second withstand voltage, and which electrically connects the third power supply node to the output node in response to a voltage potential output from the load circuit;

a fourth MOS transistor which is coupled between the first power supply node and the output node, which has the first withstand voltage, and which electrically connects the first power supply node to the output node in response to one of voltage potentials of the complimentary signals;

a second voltage descending circuit which is coupled between the third MOS transistor and the fourth MOS transistor and which prevents a potential level exceeding the first withstand voltage from being supplied to the fourth MOS transistor; and a constant current element which is coupled between the first electrodes of the first MOS transistors and the first power supply node.

16. The voltage level shift circuit according to claim 15, wherein the constant current element comprises a MOS transistor.

* * * * *